United States Patent [19]

Sakai et al.

[11] 4,074,300
[45] Feb. 14, 1978

[54] INSULATED GATE TYPE FIELD EFFECT TRANSISTORS

[75] Inventors: Tetsushi Sakai, Tachikawa; Yutaka Sakakibara, Tokorozawa; Junichi Murota, Kodaira; Tsutomu Wada, Higashi-Yamato, all of Japan

[73] Assignee: Nippon Telegraph and Telephone Public Corporation, Japan

[21] Appl. No.: 657,873

[22] Filed: Feb. 13, 1976

[30] Foreign Application Priority Data

Feb. 14, 1975 Japan .................................. 50-17938

[51] Int. Cl.² ............................................ H01L 29/78
[52] U.S. Cl. ........................................ 357/23; 357/55
[58] Field of Search ........................ 357/23, 56, 55, 59

[56] References Cited

U.S. PATENT DOCUMENTS

| | | | |
|---|---|---|---|
| 3,673,471 | 6/1972 | Klein et al. | 357/59 X |
| 3,738,880 | 6/1973 | Laker | 357/59 X |
| 3,764,865 | 10/1973 | Napoli et al. | 357/15 |
| 3,780,359 | 12/1973 | Dumke et al. | 357/34 |
| 3,906,541 | 9/1975 | Goronkin | 357/22 |
| 3,942,241 | 3/1976 | Harigaya et al. | 357/23 |
| 3,943,542 | 3/1976 | Ho et al. | 357/23 |

*Primary Examiner*—Stanley D. Miller, Jr.
*Assistant Examiner*—James W. Davie
*Attorney, Agent, or Firm*—Charles W. Helzer

[57] ABSTRACT

In an insulated gate type field effect transistor comprising spaced source and drain regions, an insulating film between the source and drain regions and a gate electrode mounted on the insulating film, an inverted frustum shaped polycrystalline semiconductor layer is formed on the insulating film and the gate electrode is mounted on the polycrystalline semiconductor layer.

5 Claims, 13 Drawing Figures

INSULATED GATE TYPE FIELD EFFECT TRANSISTORS

BACKGROUND OF THE INVENTION

This invention relates to an insulated gate type field effect transistor and a method of fabricating the same.

It is a recent tendency to substitute a MOS transistor which is a representative one of the insulated gate type field effect transistors FET for a bipolar type transistor because the construction and the process steps of manufacturing the MOS transistor are simpler than those of the bipolar transistor. A typical construction of a prior art MOS (FET) transistor is shown in FIG. 1. The MOS (FET) transistor 10 shown in FIG. 1 comprises a P type silicon semiconductor substrate 12, for example, having a source region 13 and a drain region 14 which are formed by diffusing an N type impurity into the substrate. An insulating film 16 such as a film of $SiO_2$ overlies the source and drain regions 13 and 14 and an area therebetween. Source and drain electrodes 17 and 18 are formed over source 13 and drain, respectively, and a gate electrode 19 is formed on the insulating film 16. A channel 20 is formed in the area of substrate 12 between source and drain regions 13 and 14.

As can be noted from FIG. 1, the source, drain and gate electrodes of the MOS transistor having a construction as above described lie in substantially the same plane so that in order to electrically isolate each of these electrodes it is necessary to separate them by about several $\mu m$. However, as the spacing between respective electrodes is increased it is not only difficult to miniaturize the pattern but also the parasitic capacitance between the source and drain electrodes through the semiconductor substrate increases thereby rendering it difficult to operate the transistor at high frequencies. This defect is more objectionable as the output power of the transistor increases. Also the increase in the spacing between respective electrodes makes it extremely difficult to obtain high density MOS integrated circuits. Although the use of polycrystalline silicon for the gate electrode is advantageous from the standpoint of stabilizing the characteristics of the transistor, where the gate length increases the gate wiring resistance increases which causes unbalance of the current and deterioration of the high frequency characteristic of the transistor. Further, with the construction described above, contact holes and the electrodes for the source and drain could not be formed in self-aligning fashion so that the steps requiring utmost skill and complicated workmanship is required for forming a fine pattern, thus increasing the cost of the transistor.

SUMMARY OF THE INVENTION

Accordingly, the principal object of this invention is to provide an improved insulated gate type field effect transistor capable of operating stably at a high speed and producing a high output power.

Another object of this invention is to provide an insulated gate type field effect transistor which can be fabricated as a high density integrated circuit.

Still another object of this invention is to provide an insulated gate type field effect transistor having a small spacing between adjacent electrodes thereby decreasing the parasitic capacitance of the source and drain electrodes with respect to the semiconductor substrate of the parasitic capacitance between these electrodes thus enabling high speed operations.

A further object of this invention is to provide an improved insulated gate type field effect transistor having a small gate resistance thereby improving its high frequency characteristics.

Still another object of this invention is to provide a novel method of fabricating an insulated gate type field effect transistor wherein the process steps of manufacturing are simplified.

Another object of this invention is to provide a novel method of fabricating an insulated gate type field effect transistor which does not require the use of highly skilled working techniques or extremely complex operations.

According to one aspect of this invention there is provided an insulated gate type field effect transistor comprising a semiconductor substrate, spaced source and drain regions diffused in one surface of the semiconductor substrate, an insulating film overlying the surface of the substrate between the source and drain regions, a polycrystalline semiconductor layer disposed on the insulating film and having a shape of an inverted frustum, and electrodes formed on the source region, the drain region and the polycrystalline semiconductor layer, respectively.

According to another aspect of this invention there is provided a method of fabricating an insulated gate type field effect transistor comprising the steps of forming a first insulating film on one surface of a semiconductor substrate, forming a first polycrystalline semiconductor layer on the first insulating film, said first polycrystalline semiconductor layer being doped with an impurity at a high concentration, forming a second undoped polycrystalline semiconductor layer on the first polycrystalline semiconductor layer, etching the first and second polycrystalline semiconductor layers for forming a polycrystalline semiconductor layer of the inverted frustum shape at a portion where a gate electrode is to be formed and for exposing the first insulating film about the inverted frustum shaped polycrystalline semiconductor layer, removing portions of the exposed first insulating film according to a predetermined pattern to expose a partial surface of the semiconductor substrate, diffusing an impurity into said exposed partial surface of the semiconductor substrate to form source and drain regions spaced from each other, forming a second insulating film on the upper and side surfaces of the inverted frustum shaped polycrystalline semiconductor layer and on the exposed portions of the source and drain regions, implanting ions from above into the second insulating film, removing the portions of the second insulating film implanted with the ions, and forming electrodes at the portions where the second insulating film has been removed.

Instead of forming first and second polycrystalline semiconductor layers, a single polycrystalline semiconductor layer may be used in which case the concentration of the impurity doped therein is decreased gradually from one side toward the other side of the polycrystalline semiconductor layer.

BRIEF DESCRIPTION OF THE DRAWINGS

In the accompanying drawings.

DESCRIPTION OF THE PREFERRED EMBODIMENT

Figure 1:
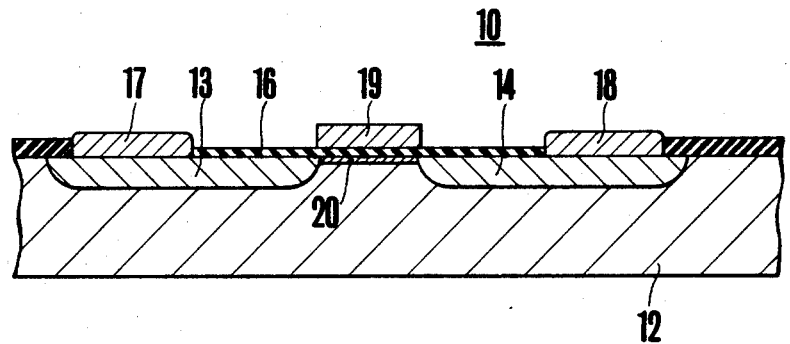
FIG. 1 is a longitudinal sectional view showing one example of the construction of a prior art insulated gate type field effect transistor.
Figure 2:
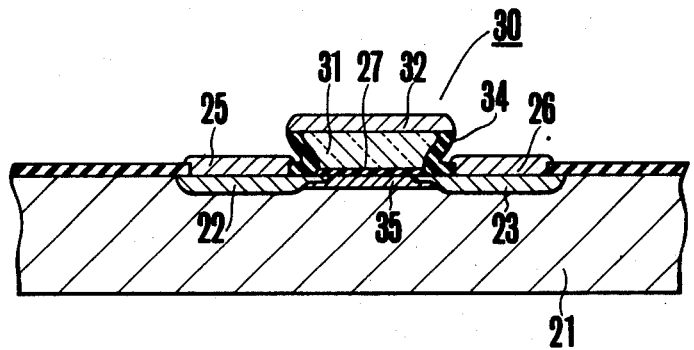
FIG. 2 is a longitudinal sectional view of one embodiment of the novel insulated gate type field effect transistor embodying the invention.

The preferred embodiment of the insulated gate type field effect transistor shown in FIG. 2 comprises a P type semiconductor substrate 21 made of silicon, spaced source region 22 and drain region 23 which are formed by diffusing an N type impurity into the semiconductor substrate 21, and a source electrode 25 and a drain electrode 26 formed on the source and drain regions 22 and 23, respectively. The area of the semiconductor substrate 21 between the source and drain regions is covered by an insulating film 27 such as an oxide film and a gate electrode member 30 embodying the invention is formed on the insulating film 27 in a manner to be described later. More particularly, on the insulating film 27 are positioned a polycrystalline semiconductor layer 31, for example a polycrystalline silicon layer having a cross-sectional configuration of an inverted frustum that is having a large upper surface than the lower surface, and a gate electrode 32 on the upper surface of the polycrystalline silicon layer 31. In the embodiment illustrated, the horizontal spacings between the gate electrode 32 and the source electrode 25 and between the gate electrode 32 and the drain electrode 26 are made to be substantially zero. However, since the gate electrode 32 is located above other electrodes at a level substantially equal to the thickness of the polycrystalline silicon layer 31, for example from 0.4 to 0.6 μm, these electrodes are isolated electrically from each other. In this embodiment an insulating film 34 is provided to cover the inclined side surface of the polycrystalline silicon layer 31. The region 35 underlying the polycrystalline silicon layer 31 acts as a channel region.

This construction has the following advantages.

(1) Since the gate electrode is located at a level above the levels of the source and drain electrodes, when these three electrodes are viewed from above, the spacing between respective electrodes is substantially zero. For this reason, it is possible to decrease the size (area) of the source and drain regions in comparison to the prior construction thereby decreasing the parasitic capacitance between the semiconductor substrate and the source and drain electrodes with the result that it is possible to obtain a field effect transistor capable of operating at higher speeds.

(2) Since the spacings between respective electrodes are reduced to substantially zero as above described it is possible to decrease the area occupied by the transistor thus increasing the density of an integrated circuit made up of such transistors.

(3) Further, it is possible to reduce the resistance of the polycrystalline silicon gate electrode more than in the conventional construction thereby improving the high frequency characteristics of the transistor.

(4) Further, this construction can eliminate various problems encountered in the manufacture of the transistor as will be discussed below, thereby reducing the cost of manufacturing the transistor.

One example of the method of fabricating the insulated gate type field effect transistor of this invention will now be described with reference to FIGS. 3A through 3J.

Figure 3A:
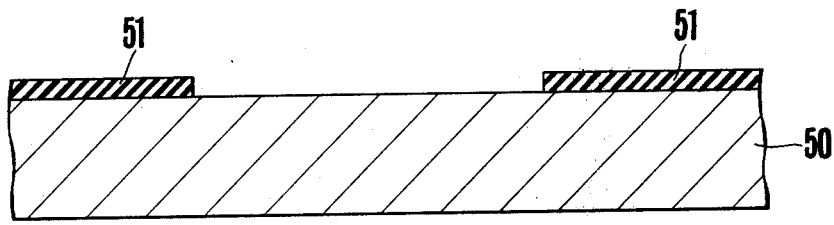
FIGS. 3A through 3J are longitudinal sectional views showing successive steps of fabricating the insulated gate type field effect transistor shown in FIG. 2

At first a $SiO_2$ film having a thickness of about 0.5 μm is formed by well known heat oxidation process on a semiconductor substrate 50 having a thickness of about 200 μm, and a resistivity of from 0.5 to 10 ohm-cm and made of P type silicon then the $SiO_2$ film is formed by photolithography according to a predetermined pattern to obtain a $SiO_2$ film 51 having a predetermined configuration, as shown in FIG. 3A.

Figure 3B:
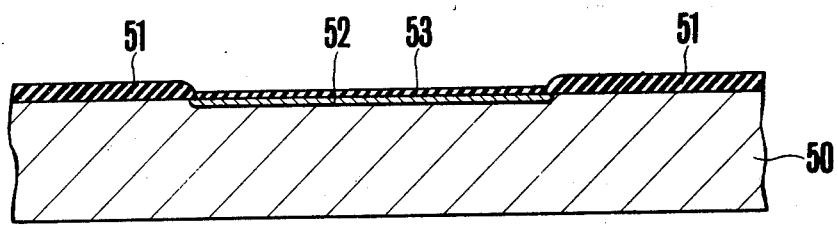
Figure 3C:
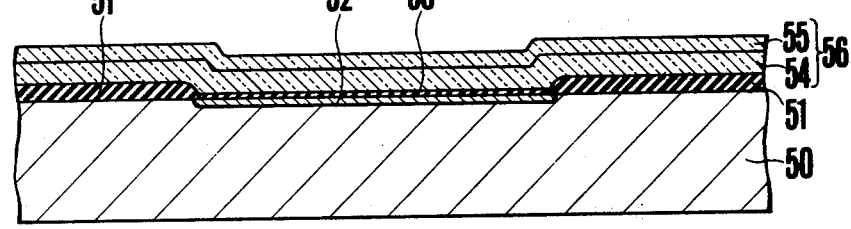

Then a P type impurity, for example boron, is diffused into the exposed area of the semiconductor substrate 50 by well known conventional diffusion method or ion implantation method to form a diffused layer 52 containing the P type impurity at a low concentration for example $1 \times 10^{17}$ atoms/cm$^3$. In some cases, this step of forming the diffused layer may be omitted. Then on the diffused layer 52 is formed a $SiO_2$ film 53 for the gate electrode by thermal oxidation method or chemical vapour deposition method to a desired thickness, about 0.1 μm for example, as shown in FIG. 3B. If desired, film 53 may comprise $SiO_2$ and $Si_3N_4$.

Then a first polycrystalline silicon layer 54 having a thickness of about 0.4 μm and doped with arsenic at high concentrations of more than $1 \times 10^{20}$ atoms/cm$^3$ is formed on the $SiO_2$ layers 51 and 53 in an atmosphere containing arsine and a silane in a manner well known in the art. Then, a second polycrystalline silicon layer 55 having a thickness of about 0.15 to 0.2 μm is formed on the first polycrystalline layer 54 in an atmosphere so called "non-dopant ambient" which contains silane without any dopant therein.

It shoud be noted that, in spite of the term "non-dopant ambient", it may contain a relatively small amount of arsenic, for example of less than $10^{18}$ atoms/cm$^3$. Under the condition shown in FIG. 3C a polycrystalline silicon layer 56 having a thickness of from 0.55 to 0.6 μm (the sum of the thickness of the layers 54 and 56) is formed.

Figure 3D:
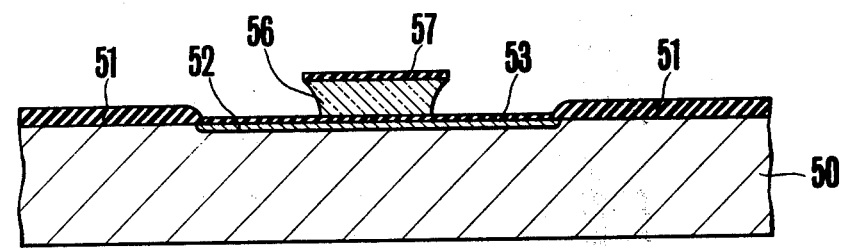

After forming an insulating layer, for example a $SiO_2$ film 57 on the polycrystalline silicon layer 56, the $SiO_2$ film is etched to have a desired pattern and the etched $SiO_2$ film 57 is used as a mask in a subsequent etching of the polycrystalline silicon layer 56 to form a mesa as shown in FIG. 3D. It should be understood that instead of using the $SiO_2$ film 57 as the mask, a photoresist may be used for etching the polycrystalline silicon layer 56. The etching solution used in this step may comprise a mixture of HF, $HNO_2$ and $H_2O$ at a ratio of 1:60:60. This etching solution has a property of increasing the etching speed as the amount of the impurity contained in the polycrystalline silicon layer 56 increases. For this reason, the second polycrystalline silicon layer 55 not doped with a dopant is etched at a slower etching speed (lower than by about one order of magnitude) than the etching speed of the first polycrystalline silicon layer 54 doped with arsenic at a high concentration. As a result, by etching a greater peripheral portion of the polycrystalline silicon layer 56, a mesa having an inverted frustum shape as shown in FIG. 3D can be obtained. The inverted frustum configuration of FIG. 3D can be obtained by etching the polycrystalline silicon layer 56 for from 5 to 5 and half minutes with the etching solution described above. Each side of the first polycrystalline silicon layer 54 is etched to a greater extent by about 0.3 to 0.4 μm than the second polycrystalline silicon layer 55 thus forming the inverted frustum.

Figure 3E:
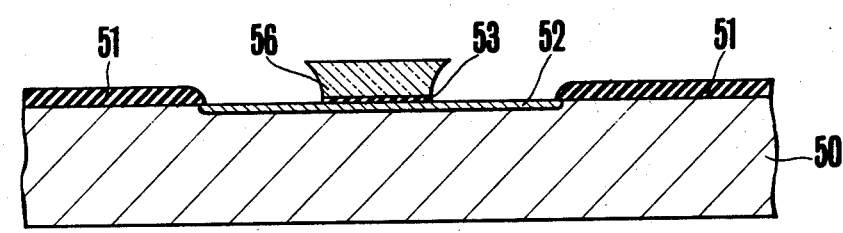

Following the above operations the entire upper surface is etched to remove the $SiO_2$ film 57 utilized to form the gate and the SiO$_2$ film 53 not covered by the polycrystalline silicon layer 56, as shown in FIG. 3E.

Figure 3F:
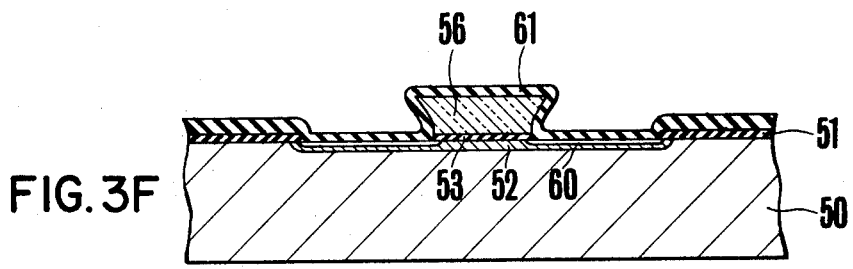

A N type impurity having a small diffusion coefficient, for example arsenic, then is diffused into the surfaces of the semiconductor substrate 50 but not the the polycrystalline silicon layer 56 by conventional diffusion technique using suitable masks to form a thin diffused layer 60 within layer 52 having a thickness of from 0.1 to 0.2 μm. Then, an insulating film 61 is formed over the entire top surface of the structure including the diffused layer 60 by well known chemical vapour deposition (CVD) method for protecting the diffused layer 60. The insulating film 61 may be made of SiO$_2$ or a mixture of SiO$_2$ and Si$_3$N$_4$. FIG. 3F shows the assembly after this treatment.

Figure 3G:
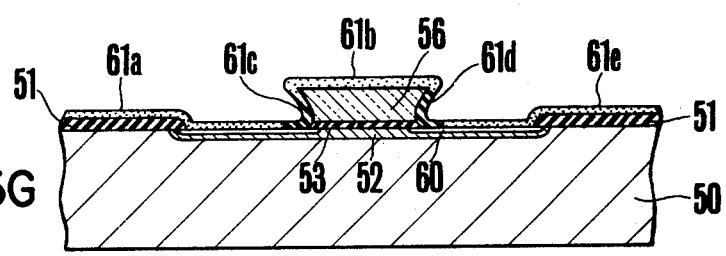
Figure 3H:
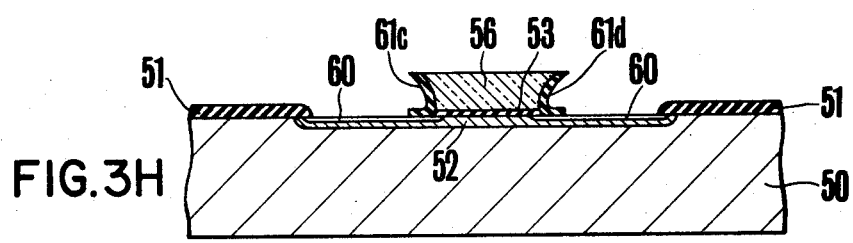

Then ions of phosphor, boron or argon are implanted from above into the insulating film 61 by well known ion implanting method. By ion-implantation method, portions 61a, 61b and 61e which are rapidly etched by an etching solution are formed on the insulating film 61 as shown in FIG. 3G. The insulating films 61c and 61d on the side surfaces of the inverted frustum shaped polycrystalline silicon layer 56 utilized to form the gate electrode member and the portions of the source and drain regions covered by the projections of the insulating films 61c and 61d are shielded by the insulating film 61b formed on the upper surface of the polycrystalline silicon layer 56. In other words, when viewed from above these portions are concealed, so that ions will not be implanted into these portions.

Where boron is implanted with ion dose of $1 \times 10^{15}$ atoms/cm$^2$, the etching speed of the portions implanted with ions of boron is 2 to 3 times of that of the portions not implanted with ions when buffered hydrofluoric acid is used for a SiO$_2$ film whereas about 3 to 4 times when hot (about 160° C to 170° C) phosphoric acid is used for a Si$_3$N$_4$ film. For this reason, it is possible to selectively remove by etching portions implanted with ions and leave the portions not implanted with ions where a suitable etching solution is used. This condition is shown in FIG. 3H. Accordingly, contact holes for respective electrodes can be formed in the self-aligning fashion without using prior complicated photolithography.

Figure 3I:
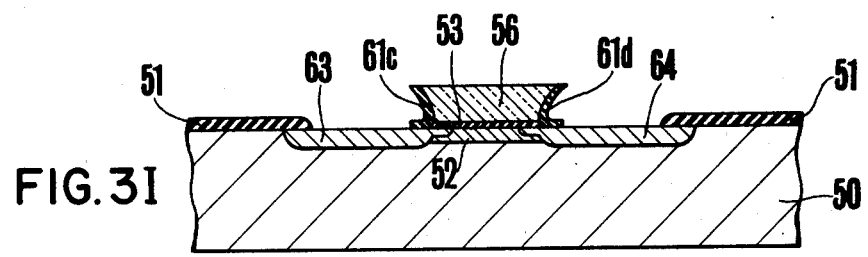

Then, as shown in FIG. 3I, an N type impurity having a large diffusion coefficient, for example phosphor, is diffused into the layer 60 to increase the thickness thereof by about 0.5 μm. Consequently, the depths of the P-N junctions between the diffused layers 63 and 64 whose thickness has been increased as above described and which are utilized as the source and drain regions, and the semiconductor substrate 50 are increased so that it is possible to readily form stable ohmic contacts for the source and drain regions. However, this process step may be omitted in case where it is not necessary to form the P-N junctions at especially deep positions.

Figure 3J:
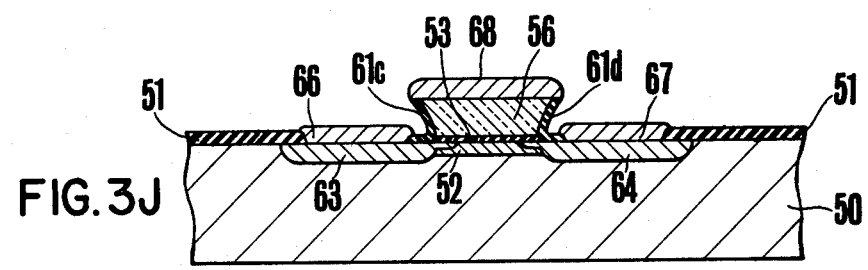

Then electrodes having desired shapes are formed on the source and drain regions and the gate electrode member, respectively, as shown in FIG. 3J by vapour depositing a metal such as aluminum, molybdenum and tungsten and then photo-etching the deposited metal layer. The spacings between the source electrode 66 and the gate electrode 68 and between the gate electrode 68 and the drain electrode 67 are determined in the self-aligning fashion by the difference in the levels of the electrodes 66, 67 and 68, and these electrodes are isolated from each other by the spacings. Accordingly, the accuracy of forming the electrodes may be lower than that of the electrodes of the conventional construction.

The element fabricated in this manner is mounted in a casing to complete an insulated gate type field effect transistor.

Although in the foregoing embodiment, a silicon semiconductor substrate was used, the substrate may be made of germanium or the compound semiconductors. Further, instead of using a P type semiconductor substrate an N type semiconductor substrate can also be used in which case respective regions are formed as P type. Instead of forming the polycrystalline silicon layer with a layer doped with an impurity and a layer undoped with the impurity, it is also possible to gradually decrease the concentration of the impurity in the polycrystalline silicon layer from side facing the insulating film. Arsenic used as the dopant may be substituted by other impurity, phosphor for example.

The above described method has the following advantages.

(1) Self-aligning technique being taken into account all over the present invention as far as applicable, the steps requiring utmost skill and complicated procedures such, as the steps of prior art photolithography, electrode formation and so forth are not needed at all in the fabricating of field effect transistors according to the invention (2) Further, simplification of the fabricating process by means of self-aligning concept as explained above can lower manufacturing cost to a great extent in comparison with the prior art. For example, it is not necessary to form contact windows by photolithography.

By comparing the novel insulated gate type field effect transistor of this invention with the insulated gate type field effect transistor of the prior art type, the following results were obtained as shown in Tables I and II.

Table I

|  | Number of steps of photolithography requiring accurate alignment of positions | Area occupied by a transistor | Parasitic capacitance between source and drain and semiconductor substrate | High frequency output impedance (1–2 GHz) | High frequency output (1–2 GHz) |
| --- | --- | --- | --- | --- | --- |
| Conventional transistor | 2 | 1 | 1 | 1 | 1 |
| Novel transistor | 0 | 0.5 | 0.5 | 2 | 4 |

Table II

|  | Parasitic capacitance between bit wire and substrate | Capacitance required to form one bit | Cell area | Wiring resistance of bit wire | Number of steps of photolithography requiring accurate alignment of positions |
| --- | --- | --- | --- | --- | --- |
| Memory cell |  |  |  |  |  |

Table II-continued

| | Parasitic capacitance between bit wire and substrate | Capacitance required to form one bit | Cell area | Wiring resistance of bit wire | Number of steps of photo-lithography requiring accurate alignment of positions |
|---|---|---|---|---|---|
| area formed by conventional silicon gate technique | 1 | 1 | 1 | 1 | 1 |
| Memory cell area formed by the present invention | 0.38 | 0.38 | 0.63 | 0.002 | 1 |

Table I shows the result of comparing unit transistors while Table II the result of comparing integrated memory circuits.

Figure 4:
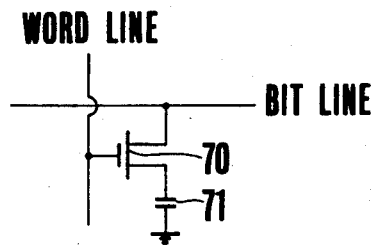
FIG. 4 is a partial connection diagram of one cell of the memory device utilizing the present invention.

FIG. 4 shows the construction of one cell of the memory circuit comprising one field effect transistor 70 and a capacitor 71. The date shown in Table II were obtained by utilizing a semicondutor substrate made of a P type silicon substrate having a resistivity of 5 ohm-cm, a substrate-drain voltage of 8V, a spacing between transistors of 4 μm, a width of the bit wire of 4 μm, a surface resistance of the diffused layer of the bit interconnection of 50 ohms, the length of the silicon gate of 5 μm, the width of the gate electrode of 8 μm and aluminum wirings.

What is claimed is:

1. An insulated gate type field effect transistor comprising a semiconductor substrate; spaced-apart source and drain regions formed at one surface of said semiconductor substrate; a first insulating film overlying the surface of said substrate between said source and drain regions; a polycrystalline semiconductor gate layer disposed over said first insulating film and having a deliberately formed inverted frustum shape; the top surface of the inverted frustum being at a different level from the level of the source and drain regions and the outer peripheral edges of the projection of the top surface of the inverted frustum onto the substrate being substantially coextensive with the inner peripheral edges of the source and drain regions; source, drain and gate electrodes formed on said source region, said drain region and said polycrystalline semiconductor gate layer, respectively, and second insulating films formed over substantially the entire side surface of said polycrystalline semiconductor gate layer between said gate electrode and said source electrode and between said gate electrode and said drain electrode and extending to and covering the top surface areas of the substrate surrounding the gate layer, said last mentioned top surface areas being substantially defined by projecting the top peripheral surface of said inverted frustum gate layer down upon the top surface of the substrate whereby horizontal spacing between adjacent electrodes is essentially zero and parasitic capacitive coupling between the electrodes is minimized.

2. The field effect transistor according to claim 1 wherein said first and second insulating films comprise $SiO_2$.

3. The field effect transistor according to claim 1 wherein each of said first and second insulating films comprise $SiO_2$ and $Si_3N_4$.

4. The field effect transistor according to claim 1 wherein the transistor is fabricated along with a number of other interconnected elements on a common substrate to form an integrated circuit structure.

5. The field effect transistor according to claim 1 wherein the inverted frustum-shaped polycrystalline semiconductor gate layer is fabricated from two differently composed semiconductor layers having different etching speed properties whereby the inverted frustum shape is deliberately formed.

* * * * *